United States Patent [19]
Luteran

[11] 3,944,923
[45] Mar. 16, 1976

[54] DEVICE FOR SENSING THE DIRECTION OF MOTION

[76] Inventor: Frank Kenneth Luteran, 10 Charles St., Auburn, N.Y. 13021

[22] Filed: May 22, 1974

[21] Appl. No.: 472,280

[52] U.S. Cl. ................................ 324/165; 324/175
[51] Int. Cl.² ..................... G01P 3/52; G01P 3/36
[58] Field of Search .................... 324/168, 165, 175

[56] References Cited
UNITED STATES PATENTS

| | | | |
|---|---|---|---|
| 3,264,639 | 8/1966 | Lerman et al. ................... | 324/168 |
| 3,299,702 | 1/1967 | Hulme .......................... | 324/165 UX |
| 3,313,945 | 4/1967 | Clinton ........................ | 324/175 |
| 3,728,565 | 4/1973 | O'Callaghan ................... | 324/165 |
| 3,783,339 | 1/1974 | Matty .......................... | 324/165 UX |

OTHER PUBLICATIONS

J. Kumar, V. Kumar, A. Gupta, "On RPM and AF Meter," J. Inst. Eng. (India) Electron. & Telecommun. Eng. Div., Vol. 52, No. 7 (Mar. 1972).

*Primary Examiner*—Alfred E. Smith
*Assistant Examiner*—Rolf Hille

[57] ABSTRACT

A device for sensing and indicating the direction of motion of a moving member. A discontinuity is formed on a moving member. Two sensors capable of detecting the discontinuity are spaced apart a distance less than the width of the discontinuity. Logic circuitry determines which sensor detection occurs before both sensors produce coincident detections. The sensor detection occurring before coincidence unambiguously indicates the direction of motion. A gating circuit produces an output signal for one direction of motion and a second signal for the opposite direction of motion.

6 Claims, 4 Drawing Figures

DEVICE FOR SENSING THE DIRECTION OF MOTION

BACKGROUND OF THE INVENTION

The present invention relates to a device for sensing the direction of motion of a moving member such as a rotating shaft or a linear actuator. An output signal is generated for one direction of motion and a second output is generated for the opposite direction of motion.

DESCRIPTION OF THE PRIOR ART

Known devices for sensing the rotational direction of a shaft include DC and AC generators. The DC generator when coupled to a rotating shaft will generate a voltage whose polarity is dependent on the direction of rotation of the shaft. An AC generator type device described in U.S. Pat. No. 3,728,565 determines the direction of rotation by comparing the phase relationship of the voltages generated in the stator windings. Both the AC and DC types require that complex and costly rotors be attached to the rotating shaft for direction sensing. These complex rotors are generally large and cannot be easily retrofitted to existing machines. Since these sensing devices operate on induction principles, they usually have a limited speed range for operation. They will not operate at near zero rotational speeds nor at excessively high speeds. These devices are further limited to sensing only rotational motion.

A contacting type direction sensor is described in U.S. Pat. No. 3,120,655. The problem of contact wear and inability to operate over a large speed range are the shortcomings of this type system.

Other systems use the direction of change of the sensor output to determine direction of motion. These differentiation type systems are susceptible to produce false indications due to noise pulses on the sensor and supply lines. U.S. Pat. No. 3,614,616 is an example.

SUMMARY OF THE INVENTION

It is one object of the invention to provide an economical apparatus to sense the direction of motion of a moving member.

A second object of the invention is to provide an apparatus that utilizes sensor level changes rather than the direction of change to logically determine direction of motion.

Another object of the invention is to provide a sensing apparatus that can utilize a wide range of sensor types.

Still another object of the invention is to provide sensing of a moving member over a large dynamic range from zero to the maximum speed of the moving member.

Yet another object of the invention is to provide a distinct output signal indicative of one direction of motion and another distinct signal indicative of the reverse direction of motion.

With these objects in view, the invention provides a motion sensing device including a member with at least one discontinuity on the member, a pair of sensors capable of producing a signal when the discontinuity is in proper alignment with the sensors, timing logic circuitry for determining the sequence in which the sensors detect the discontinuities and a gating circuit for producing signals to indicate the direction of motion of the member.

The discontinuity on the moving member is located so that its path of motion brings it within sensing proximity of each sensor. The width of the discontinuity is made greater than the spacing of the sensors thereby providing a member position in which each sensor simultaneously detects the discontinuity. In the case of rotational motion, the discontinuity is located in arcuate relationship to the center of rotation of the member.

The discontinuity may consist of a hole in the moving member, a magnet mounted on the member, an area of ferrous material in a nonferrous member, an area of different light transmissability in the member, an area of different reflectivity in the member or an indentation in the member. The sensor chosen will be capable of producing a detection signal when the discontinuity is in sensing proximity. The various sensors available to detect the listed discontinuities are well known in the art.

Prior to the coincident detection only one of the sensors will produce a detection if the member is moving in one direction and the other sensor will produce the prior detection if the member is moving in the opposite direction. The sensor detections are coupled to a logic circuit which performs the required logic operations to determine which sensor produced the detection prior to the coincident detections. Logic circuits consisting of AND gates and flip flops are used to perform this operation. The logic means may be pneumatic, fluidic, hydraulic, electro-mechanical or electronic since an equivalence can be constructed by those practicing the art. The logic waveforms thus generated are used to gate output signals on either of two output lines. Output signals are present on one output line if motion in one direction occurs and on the other output line if the reverse motion occurs. Since the output signals do not occur concurrently they may be summed to appear on a single output line with one signal polarity indicating one direction of motion and the opposite signal polarity indicating the opposite direction of motion.

The invention is not limited to having only one discontinuity on the moving member. Any number of discontinuities may be utilized as long as the relationship exists where one sensor will detect the discontinuity prior to coincident detection for motion in one direction and the other sensor will detect the discontinuity prior to coincident detection for motion in the opposite direction. The use of additional discontinuities will enable the continuous detection of motion of large linear mechanisms.

When the invention is applied to rotating shafts, the use of additional discontinuities will give additional pulse output signals for each revolution, thereby enabling the determination of the direction of motion for small angular displacements.

DESCRIPTION OF THE PREFERRED EMBODIMENT

Figure 1:
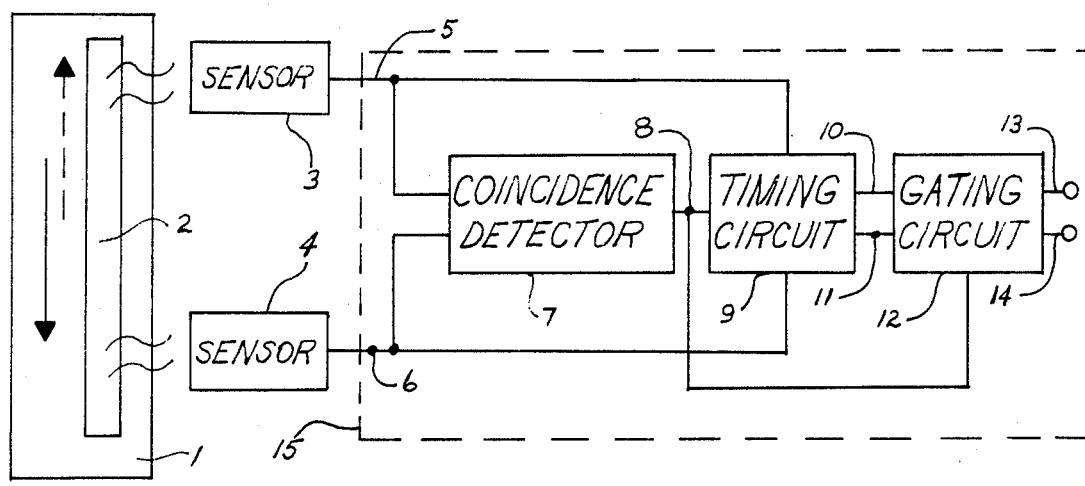
FIG. 1 is a block diagram illustrating the functional elements of the invention.

FIG. 1 shows a direction sensing device in which the direction of motion of moving member 1 is sensed. A discontinuity 2 in member 1 is moved within sensing proximity of sensors 3 and 4. The sensors 3 and 4 are spaced to permit simultaneous detection of the discontinuity. The discontinuity width is made greater than the spacing width of the sensors. The sensor 3 and sensor 4 detections are coupled through lines 5 and 6 into logic circuit 15 and particularly to detector 7 which produces a signal on line 8 when the detections occur simultaneously. The output signal of coincidence detector 7 is coupled through line 8 to timing circuit 9. The sensor 3 and 4 detections are also coupled, through lines 5 and 6, to timing circuit 9.

Timing circuit 9 generates two signals from sensors 3 and 4 outputs and coincidence detector 7 output. The timing circuit 9 output coupled through line 10 to gating circuit 12 is an enable signal with the enable duration from the time of detection by sensor 3 to the start of exclusive detection by sensor 4. Exclusive detection is the period when only one sensor is producing a detection. The timing circuit 9 output coupled through line 11 to gating circuit 12 is an enable signal with the enable period from the time of detection by sensor 4 to the start of exclusive detection by sensor 3.

Gating circuit 12 combines the enable signal, coupled through line 10, with the coincidence detector 7 output signal, coupled through line 8 to produce an output signal on line 14 whenever sensor 3 detection occurs prior to the coincidence detection, which occurs when member 1 moves in the direction indicated by the arrow in FIG. 1. Gating circuit 12 also combines the enable signal coupled through line 11 with the coincidence detector 7 output coupled through line 8 to produce an output signal on line 13 whenever sensor 4 detection occurs prior to the coincidence detection, which occurs when member 1 moves in the direction of the broken arrow in FIG. 1.

Figure 2:
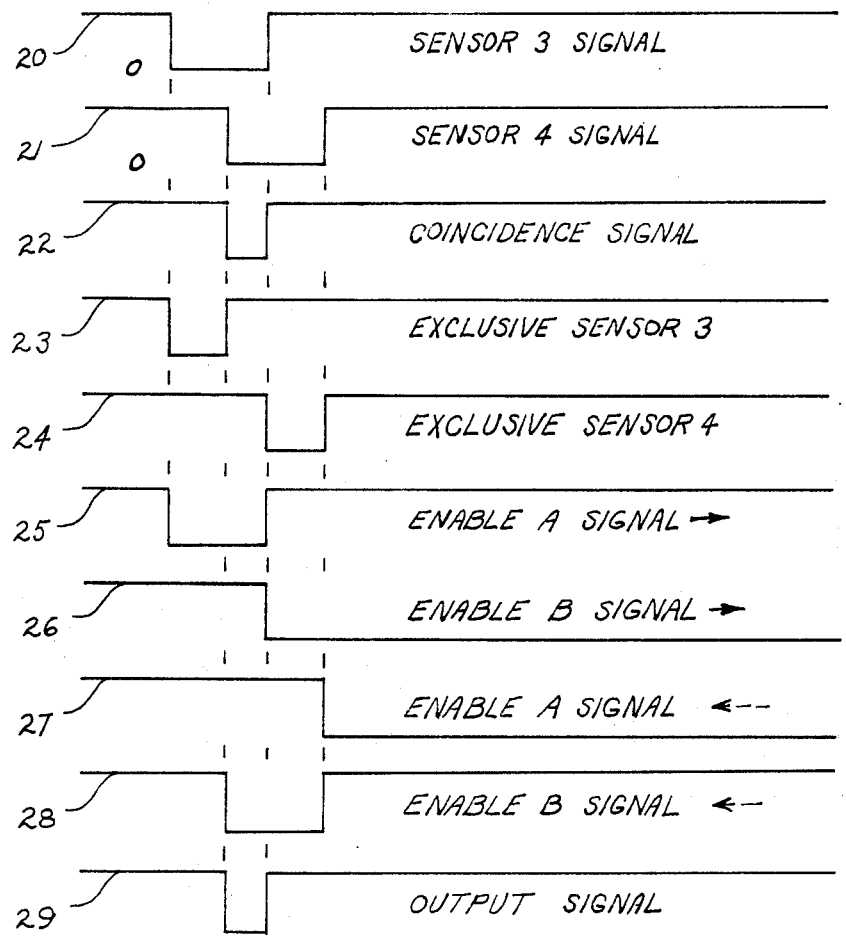
FIG. 2 shows the output signals occurring at various points in the system illustrated in FIG. 1.

Referring to FIG. 2, waveform 20 represents the output signal of sensor 3 and waveform 21 the output signal of sensor 4. The zero level indicates the time during which sensor detection occurs. The waveforms in FIG. 2 when moving from left to right represent the signals generated by member 1 in FIG. 1 moving in the direction indicated by the arrow. Waveform 22 is the output signal of coincidence detector 7 and represents the time when waveforms 20 and 21 are both at the zero level. Waveform 23 is the exclusive sensor 3 output occurring when only sensor 3 is producing a detection output. Waveform 24 is the exclusive sensor 4 output occurring when only sensor 4 is producing a detection output. The exclusive sensor signals are generated in timing circuit 9 and are used to generate the enable signals which are coupled into gating circuit 12. Waveform 25 is the enable signal and represents the time from the start of exclusive sensor 3 signal waveform 23 to the start of exclusive sensor 4 signal waveform 24. Waveform 26 is the enable B signal and represents the time from the start of exclusive sensor 4 signal waveform 24 to the start of exclusive sensor 3 signal waveform 23. When member 1 in FIG. 1 moves in the direction of the broken arrow, only the enable waveforms change and are represented by waveforms 27 and 28. The enable signals are combined with the coincidence signal in gating circuit 12 to produce output signal waveform 29. For member 1 motion in the direction of the arrow, waveform 29 will appear at output 14. Motion of member 1 in a direction opposite to the arrow will produce waveform 29 at output 13.

Figure 3:
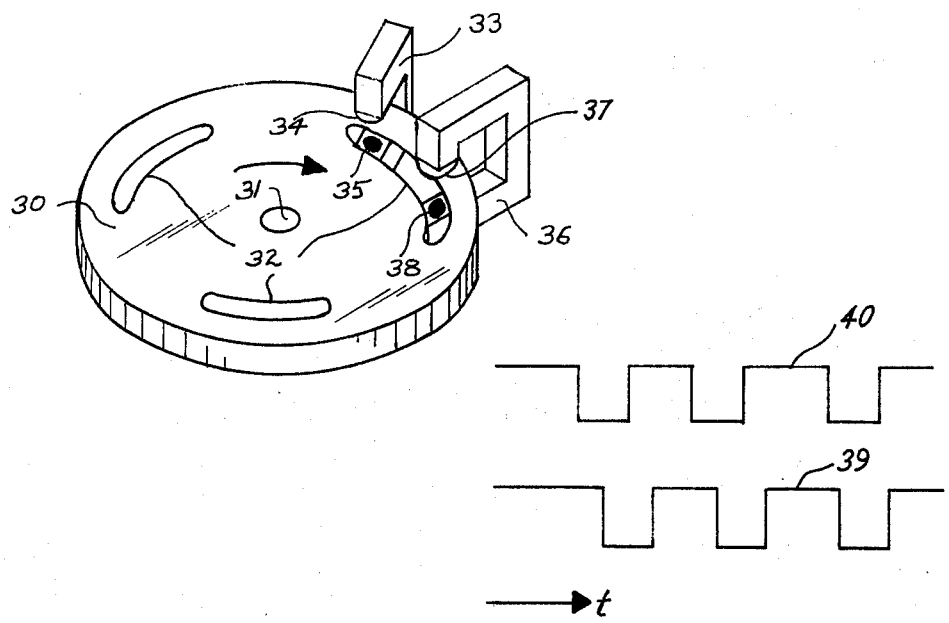
FIG. 3 is a plan view showing the relationship of a rotating member and sensors.

FIG. 3 shows circular member 30 attached to rotating shaft 31. Three arcuate slots 32 are spaced equidistant on the circular member. The arcuate spacing between adjacent slots is greater than the arcuate length of the slots. A first sensor housing 33 is positioned to non-contactingly straddle member 30 with slots 32 passing within the arms of the housing. A light source 34 is located in the upper arm of housing 33 and a light detector 35 is located in the lower arm of housing 33. Source 34 and detector 35 are positioned so that a light conducting path exists between them when slot 32 is in proper rotational alignment with housing 33. A second sensor housing 36 also positioned to non-contactingly straddle member 30 has light source 37 located in the upper arm and a light detector 38 in the lower arm. Source 37 and detector 38 are positioned so that a light conducting path exists between them when slot 32 is in proper rotational alignment with housing 36. Housing 33 is spaced from housing 36 a distance less than the length of slot 32 thereby permitting simultaneous energization of detector 35 by source 34 and detector 38 by source 37 when each slot 32 rotationally traverses housings 33 and 36. Each complete rotation of member 30 will result in three energizations for each sensor-detector pair. For the direction of rotation indicated by the arrow, the output signal of detector 35 in housing 33 is shown by waveform 39. The output of detector 38 in housing 36 is shown by waveform 40. These waveforms when used in the system of FIG. 1 will produce output signals that unambiguously indicate the direction of rotation of member 30. Any number of slots may be put in the rotating member as long as the spacing relationships of slots and detectors do not produce ambiguous results.

Figure 4:
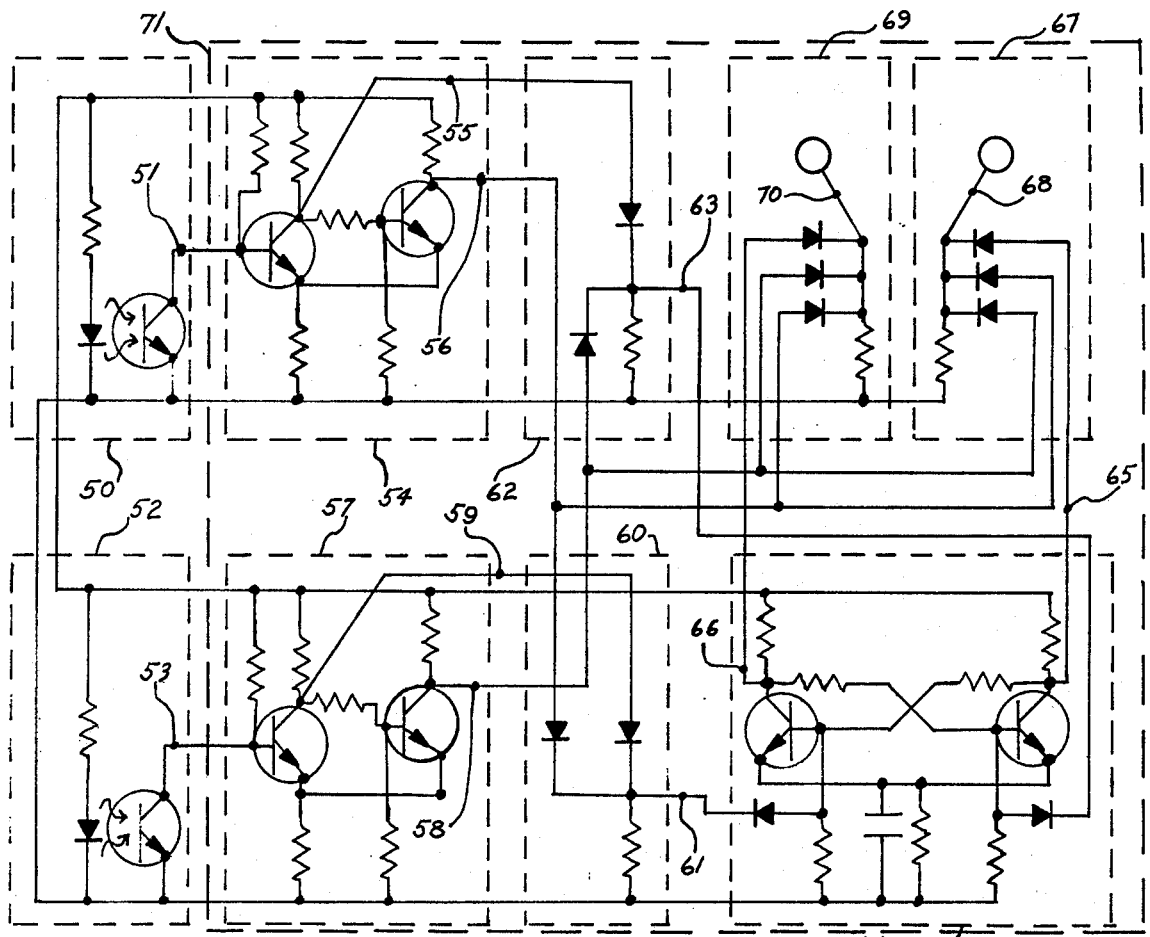
FIG. 4 is an electrical schematic diagram of a light sensor system.

In FIG. 4 electrical circuits are described to produce the functions of the elements of FIG. 1 using the rotational embodiment of FIG. 3. In some instances the logic elements of FIG. 1 are combined in the circuitry of FIG. 4 to minimize circuit components, however the logic performed in 15 and 71 is identical. A first sensor 50 operates to produce an open circuit at line 51 when no light conducting path exists between the emitter and detector and a short circuit when a light conducting path exists between the emitter and detector of sensor housing 33 in FIG. 3. A second sensor 52 operates similarly and produces either a short or open circuit at line 53 through the operation of the emitter and detector of sensor housing 36 in FIG. 3. The outputs of the sensors are processed by logic circuit 71. The output of sensor 50 is coupled through line 51 to Schmitt trigger circuit 54 where a non-inverted sensor 50 output is produced at line 56 and an inverted sensor 50 output at line 55. In a similar manner Schmitt trigger 57 produces a non-inverted sensor 52 output at line 58 and an inverted sensor 52 output at line 59. AND circuit 60 combines the non-inverted output of sensor 50 and the inverted output of sensor 52 to produce an exclusive sensor 50 signal on line 61. AND circuit 62 combines the non-inverted output of sensor 52 and the inverted sensor 50 output to produce an exclusive sensor 52 output on line 63. FLIP FLOP circuit 64 generates enable A signal on line 65 and enable B signal on line 66. AND circuit 67 combines the non-inverted sensor outputs 56 and 58 to produce the coincidence signal which is further combined with enable A signal to produce an output signal at 68 when sensor 50 of housing 33 produces an output signal prior to simultaneous detections by both sensors. Motion of member 30 in the direction of the arrow will result in an output signal being generated by AND circuit 67. AND circuit 69 also combines the non-inverted sensor outputs 56 and 58 to produce the coincidence signal which is further combined with enable B signal to produce an output signal at 70 when sensor 52 of housing 36 produces an output signal prior to simultaneous detections by both sensors. Motion of member 30 in the direction opposite to the arrow will result in an output signal being generated by AND circuit 69.

An output pulse will appear at either AND circuit 69 or AND circuit 67, but can never appear at both outputs simultaneously since the AND circuits are alternately driven by the FLIP FLOP.

In a typical installation at least one discontinuity is placed on a moving member and the pair of sensors positioned to sense the moving discontinuity. The sensors are spaced from each other a distance that will produce a simultaneous detection width equal to one half of the total sensor detection width. This will produce coincidence and exclusive detection pulses of equal time durations. The two directional output signals are then coupled to light indicating or alarm circuits which will then be energized by relative motion of the member in the proper direction.

I claim:

1. A motion detection apparatus comprising;
   a. a moving member having a discontinuity,
   b. a first sensor positioned to detect the discontinuity and producing a first detection signal,
   c. a second sensor positioned to detect the discontinuity producing a second detection system and spaced from the first sensor a distance that will enable the first and second sensors to simultaneously detect the discontinuity during a portion of their separate detections,
   d. means for logically determining from the first and second detection signals the relative direction of motion of the moving member, the logic means having circuits that determine the direction of motion by determining which sensor detection occurs prior to the simultanwous detections, the circuits composed at a first Schmitt circuit responsive to the detection signal of the first sensor and producing a first non-inverted and a first inverted output signal, a second Schmitt circuit responsive to the detection signal level of the second sensor and producing a second non-inverted and a second inverted output signal, a first AND circuit having inputs coupled to the first non-inverted output and the second inverted output and producing an output signal that represents an exclusive first sensor output, a second AND circuit having inputs coupled to the second non-inverted output and the first inverted output and producing an output signal that represents an exclusive second sensor output, a flip flop cirucit having a first input coupled to the output of the first AND circuit and a second input coupled to the output of the second AND circuit and producing a first enable output signal for the time period between the first and second input signals and producing a second enable output signal for the time between the second and first input signals, a third AND circuit having inputs coupled to; the first enable output of the flip flop, the first non-inverted output of the first Schmitt circuit and the second non-inverted output of the second Schmitt circuit and producing a first directional output whenever the first sensor output occurs prior to simultaneous detection by both sensors, a fourth AND circuit having inputs coupled to; the second enable output of the flip flop, the first non-inverted output of the first Schmitt circuit and the second non-inverted output of the second Schmitt circuit and producing a second directional output whenever the second sensor output occurs prior to simultaneous detection by both sensors.

2. The apparatus in claim 10 wherein the sensors produce detection outputs dependent on the relative position of the sensor and discontinuity.

3. The apparatus in claim 1 wherein the discontinuity comprises a permanent magnet and the sensors are magnetic flux detecting devices.

4. The apparatus in claim 1 wherein the discontinuity comprises an area having a light transmissability different from the moving member and the sensors are light detecting devices.

5. The apparatus in claim 1 wherein the discontinuity comprises an area having a light reflectivity different from the moving member and the sensors are light detecting devices.

6. The apparatus in claim 1 wherein the discontinuity comprises an indentation in the member and the sensors are fluidic devices.

* * * * *